United States Patent [19]

Fishkin et al.

[11] Patent Number: 5,697,750
[45] Date of Patent: Dec. 16, 1997

[54] CONTROLLED ENVIRONMENT ENCLOSURE AND MECHANICAL INTERFACE

[75] Inventors: Boris Fishkin, San Jose; Seiji Sato, Palo Alto; Robert B. Lowrance, Los Gatos, all of Calif.

[73] Assignee: Applied Materials, Inc., Santa Clara, Calif.

[21] Appl. No.: 515,787

[22] Filed: Aug. 16, 1995

Related U.S. Application Data

[62] Division of Ser. No. 312,487, Sep. 26, 1994, which is a continuation of Ser. No. 972,659, Nov. 6, 1992, abandoned.

[51] Int. Cl.$^6$ .................................................. B65G 49/07
[52] U.S. Cl. .......................... 414/217; 414/416; 414/939
[58] Field of Search .................................. 414/217, 292, 414/411, 416, 939, 940

[56] References Cited

U.S. PATENT DOCUMENTS

| | | | |
|---|---|---|---|
| 4,260,312 | 4/1981 | Hackney | 414/292 |
| 4,616,683 | 10/1986 | Tullis et al. | 414/217 X |
| 4,995,430 | 2/1991 | Bonora et al. | 414/217 X |
| 5,044,871 | 9/1991 | Davis et al. | 414/217 X |
| 5,056,875 | 10/1991 | Akins | 414/217 X |
| 5,139,459 | 8/1992 | Takahashi et al. | 414/217 X |
| 5,169,272 | 12/1992 | Bonora et al. | 414/217 |
| 5,433,574 | 7/1995 | Kawano et al. | 414/217 |

FOREIGN PATENT DOCUMENTS 1064335  3/1989  Japan .................... 414/940

*Primary Examiner*—James W. Keenan
*Attorney, Agent, or Firm*—Patterson & Streets, L.L.P.

[57] ABSTRACT

A system for vacuum-processing objects such as electronic integrated circuit wafers comprises (a) a carrier for transporting the wafers under vacuum in a cassette, the cassette being supported on a movable wall that serves as a bottom cover member of the carrier; and (b) a processing machine having a transfer chamber that is also maintained under vacuum, the transfer chamber having a movable wall in the form of an elevatable stage that sealingly closes the transfer chamber in its outermost position. There is a small sealingly closed interface chamber extending between the movable walls when the cassette is mounted onto the machine. A vacuum pump evacuates the interface chamber in preparation for lowering of the cassette into the transfer chamber by an elevator mechanism.

10 Claims, 1 Drawing Sheet

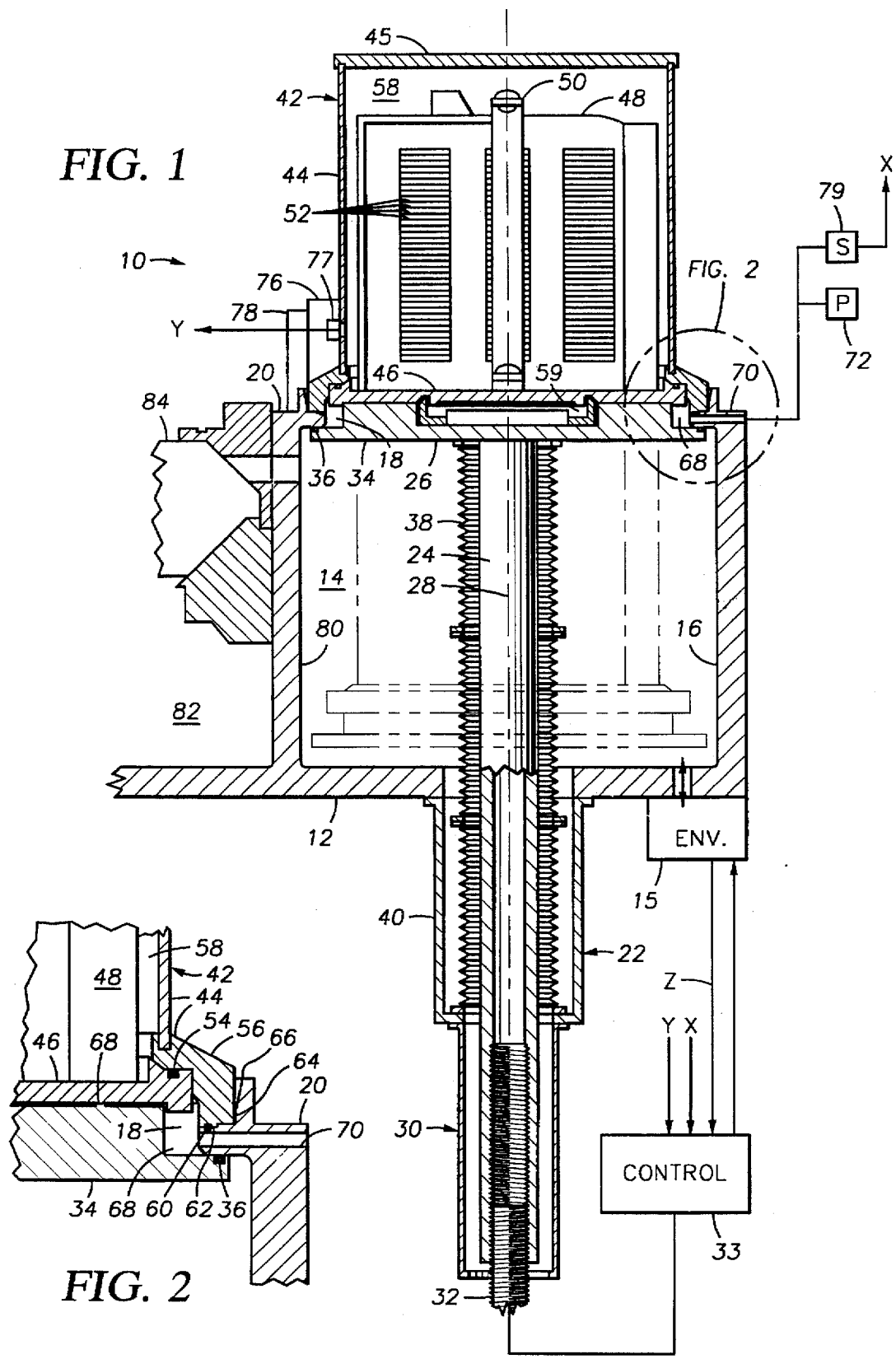

CONTROLLED ENVIRONMENT ENCLOSURE AND MECHANICAL INTERFACE

CROSS-REFERENCE

This is a Divisional of U.S. patent application Ser. No. 08/312,487 filed on Sep. 26, 1994, which is a continuation application of U.S. patent application Ser. No. 07/972,659 filed on Nov. 6, 1992, now abandoned. The present application is related to U.S. patent application Ser. No. 07/973,112, issued from continuation application Ser. No. 08/229,071 as U.S. Pat. No. 5,391,035, filed on the same date as this application, entitled "MICRO-ENVIRONMENT LOAD LOCK," by Gordon P. Krueger, which is incorporated herein by this reference.

BACKGROUND

The present invention relates to systems for transporting materials, parts, or any other objects between controlled environments without introducing contamination from an intervening uncontrolled environment, and more particularly, to such systems as applied to processes for manufacturing high density electronic integrated circuits.

A serious problem in integrated circuit manufacturing is the presence of particulates and other forms of contamination on and about the wafers on which the circuits are formed. For example, exposure to ambient air gives rise to wafer surface modification, such as by oxidation, nitrification, adsorption of water vapors or other impurities. This surface modification can require additional steps of wafer surface preparation prior to further processing. One of the major sources of particulate contamination is human-generated, including both particles which are released by human bodies and particles which are stirred up by equipment operators moving around inside a semiconductor processing facility. This aspect of the problem has led to the development of various forms of mechanized and automated processing systems, and enclosed carriers for transporting the wafers between and within such systems. However, the mechanisms themselves are potential generators of particulates. Thus the exclusion of particulates continues to be a limiting factor as device dimensions become smaller and smaller because of the need to avoid the presence of smaller and smaller particles, and because of increased demand for larger integrated circuits.

U.S. Pat. No. 4,995,430 to Bonara et al. discloses a sealable, transportable container that, in one configuration, provides a Standardized Mechanical Interface (SMIF) pod for semiconductor wafers, the pod or carrier including a box, a box door or panel that sealingly closes the bottom of the box, and a wafer cassette that is supported on the panel within the box. A processing station for receiving the carrier comprises a protective canopy having a loading port, a port door or platform that closes the port being lowerable within the canopy together with the panel and the cassette, the box being retained at the port. The station also includes a manipulator that can move the cassette from the lowered panel for processing of the wafers and then replace the cassette on the panel, the panel being finally raised with the cassette to the box, the reassembled carrier being released from the loading port. The Bonara et al. patent also discloses separate seals between the panel and the box, between the box and the port, and between the platform and the port. A fluid injection/extractor that is mounted to the loading port and fluid-coupled through the box provides means for cleaning the interior of the carrier by alternately evacuating and pressurizing the space within the box. The Bonara et al. patent further discloses that particles that may have been external surfaces of the panel and the platform are trapped between the panel and the platform by the simultaneous lowering of the panel with the platform.

Many contemporary wafer processing apparatuses are equipped with vacuum load locks. U.S. Pat. No. 5,044,871 to Davis et al. discloses a vacuum wafer carrier that is placed onto a vertically movable stage within an upper chamber of a load lock. When the stage is lowered, a cover of the carrier remains supported by a floor portion of the upper chamber while a cassette of the carrier is lowered into a lower chamber of the load lock. The upper chamber is provided with a load lock cover that is closed after the carrier is placed into the upper chamber. The upper chamber has a vacuum port and a purge port, and a vacuum seal is provided between the floor of the upper chamber and the stage. In one configuration, another vacuum seal is provided between the cover of the carrier and the upper chamber floor. The carrier is represented as maintaining a vacuum during transport and storage, the cover of the carrier being secured by differential pressure.

Notwithstanding the disclosures of Bonara et al. and Davis et al., typical systems for preventing contamination of sensitive articles by particulates and the like at and between process stations remain subject to one or more of the following disadvantages:

1. A relatively large volume must be evacuated prior to processing when the processing is to be performed at less than atmospheric pressure. This is true for the load lock of Davis et al. whether the upper lock chamber or the lower lock chamber is evacuated during a loading cycle. Similarly, Bonara et al. disclose evacuation of the carrier for cleansing the carrier by alternately evacuating and pressurizing the carrier.

2. The lower lock chamber of Davis et al. is subject to contamination from the upper lock chamber and from particulates that may fall onto the stage or that may stick to a bottom surface of the carrier. Similarly, the panel and platform of Bonara et al. are subject to this type of contamination. The contamination is not necessarily trapped between the panel and the platform, but is likely to be dislodged and mobilized when the space between the carrier and the stage or platform is evacuated, the particles moving into an environment that is shared by the wafers during processing.

Thus there is a need for a system that permits transport of wafers by a carrier between controlled environments without these disadvantages.

SUMMARY

The present invention meets this need by enabling the contents of a first chamber to be moved into a second chamber without contaminating either chamber with ambient air.

In one aspect of the invention, a system for transporting an object from a first environment into a second environment without contamination by ambient air comprises:

(a) a first housing having a first environment therein, the first housing having a movable wall for supporting the object and for closing the first housing;

(b) a second housing having a second environment therein, the second housing having a movable wall for closing the second housing;

(c) means for locating the first housing relative to the second housing with the movable wall of the first chamber in proximate contact with the movable wall of the second chamber, an interface volume extending between the two movable walls;

(d) a passage for evacuating the interface volume, the passage being isolated from the first and second chambers when the chambers are closed by their respective movable walls;

(e) means for moving the movable wall of the second housing into the second housing; and (f) means for moving the movable wall of the first housing and the object into the second housing.

Instead of exhausting the interface volume, it can be pressurized through the passage if the chambers are to be pressurized.

Preferably the system includes means preventing the movable wall of the second housing from moving into the second housing until after the interface volume has been evacuated.

The system can further include an interface seal for sealingly connecting the first housing to the second housing, the movable walls of the first and second housing having respective first and second wall seal means for sealingly closing the respective housings, the interface volume being bounded by the interface seal means and the first and second wall seal means when the housings are closed by the respective movable walls.

The interface seal means can include a first elastomeric ring seal on the second housing for contacting an external surface of the second housing. The first wall seal means can include a second elastomeric ring seal on the movable wall of the first housing for contacting an internal surface of the first housing. The third wall seal means can include a third elastomeric ring seal on the movable wall of the second housing for contacting an internal surface of the second housing.

Preferably the interface volume is not more than about 1% of the combined volumes of the first and second chambers for facilitating efficient operation of the system.

The object can be a wafer cassette for holding a plurality of integrated circuit wafers, the first housing can be a wafer carrier enclosure for holding a spaced plurality of wafers, and the second housing can be part of a semiconductor wafer processing machine.

The invention also includes a method of utilizing the system, wherein the contents of the first chamber are moved into the second chamber by the steps of:

(a) placing the movable wall of the first chamber in proximate contact with the movable wall of the second chamber, with the interface volume extending between the two movable walls;

(b) evacuating the interface volume or adding gas through the interface volume through the passage;

(c) moving the movable wall of the second chamber into the second chamber; and (d) moving the movable wall of the first chamber and the contents of the first chamber into the second chamber.

Generally the walls are moved simultaneously for preventing any contamination that might remain between the movable walls from contaminating the second chamber, and to prevent generation of contamination. The two movable walls can be kept in contact during the steps (c) and (d) of moving the walls, i.e., the walls are moved together. The movable wall of the second chamber can be horizontally disposed, wherein the steps (c) and (d) of moving the walls comprises lowering the walls.

Preferably, when the object is to be subjected to reduced pressure in the second chamber, the method includes the further steps of maintaining the chambers in respective evacuated conditions. Thus the invention eliminates the need for evacuating large volumes of air from the chambers while safely purging the facing surfaces and any volume between the movable walls.

By maintaining the two chambers continuously in an evacuated condition, there is no requirement for evacuating a large volume of air in preparation for a process step to be done under vacuum. Further, the interface volume can be quickly evacuated to a destination separate from either chamber, thereby avoiding contamination of the chambers, particularly the second chamber, by contaminants that might otherwise be mobilized from between the movable walls during evacuation.

When the first chamber is initially at a superatmospheric or subatmospheric pressure, the pressure in the second chamber is controlled to approximately match the initial first chamber pressure. It is preferred that the method include the additional step of preventing movement of the wall of the second chamber until the interface volume has been evacuated or pressurized sufficiently to approximately equalize the pressure of the interface volume with that of the second chamber. The step of preventing the movable walls from moving can be continued until the interface volume reaches approximately the initial first chamber pressure.

DRAWINGS

These and other features, aspects, and advantages of the present invention will become better understood with reference to the following description, appended claims, and accompanying drawings, where:

FIG. 1 is a fragmentary, sectional, elevational view showing a portion of a wafer processing machine, the machine being equipped with an environmental interface system according to the present invention; and FIG. 2 is a fragmentary, sectional, elevational, detail view within region 2 of FIG. 1.

DESCRIPTION

The present invention is directed to an environmental interface system that permits efficient storage and transfer of articles to be processed, while effectively excluding even very small particulates and other contamination. Although the present invention is described primarily with regard to its use for transferring articles under subatmospheric conditions, the invention is equally suitable for transferring objects under superatmospheric conditions.

With reference to FIGS. 1 and 2, a semiconductor wafer processing machine 10 includes a base 12, a buffer chamber 14 being defined above the base 12 and having environmental control means 15 in fluid communication therewith for establishing a contaminant-free environment therein; typically under a partial vacuum that is suitable for wafer processing as further described below.

The buffer chamber 14 is sealingly bounded by side walls 16 that extend upwardly from the base 12. The side walls support a top wall 20 of the chamber 14. A main chamber opening 18 is formed in the top wall 20. An indexing elevator mechanism 22 that is supported by the base 12 includes a column member 24 and a stage member 26 that is fixably connected to an upper extremity of the column member 24. The column member 24 and the stage member 26 are vertically movable on an elevator axis 28. A column bearing assembly 30 that is mounted below the base 12 laterally supports the column member 24. The column member 24 threadingly engages a screw drive 32 that is fixably supported below the base 12 by conventional means (not shown), the column member 24 being raised and lowered conventionally by the screw drive 32, which can include a stepper motor (not shown), the screw drive 32 being responsive to a controller 33.

The stage member 26 has an outwardly extending flange portion 34, the flange portion 34 having an elastomeric stage seal 36 that sealingly engages the top wall 20 when the stage member 26 is fully raised by the screw drive 32. Axially flexible bellows members 38 enclose that portion of the column member 24 that extends within the chamber 14. A well member 40 extends below the base 12 for supporting the bearing assembly 30. The bellows members 38 are sealingly connected between the stage member 26 and a bottom extremity of the well member 40.

Thus, the chamber 14 can be totally enclosed by a housing defined by the base 12, the side wall 16, the top wall 20, and the stage member 26. Accordingly, a controlled environment, having a subatmosphere transfer chamber pressure $P_T$ that can be a suitable vacuum for processing of semiconductor circuit wafers, is maintainable in the buffer chamber 14 by the environmental control means 15 when the stage member 26 sealingly engages the top wall 20, so that the chamber 14 is sealingly isolated from ambient air. The stage member 26, when in its raised position, as shown in FIG. 1, closes the main opening 18 in the top wall 20. Thus, the stage member 26 serves as a movable wall of the chamber 14.

A semiconductor circuit wafer carrier 42 is sealingly mountable on the top wall 20 of the chamber 14, the carrier 42 having a housing formed by an enclosure portion 44, a top 45, and a bottom cover member 46. A wafer cassette 48 is releasably located on the bottom cover member 46. The cassette 48, having a latch assembly 50 for releasably anchoring the cassette 48 to the bottom cover member 46, holds a vertically spaced plurality (typically 25) of horizontally oriented semiconductor wafers 52. The bottom cover member 46 the carrier 42 holds an upwardly facing elastomeric cover seal 54 that engages a base member 56 of the enclosure portion 44. A sealed carrier chamber 58 is thereby provided within the carrier 42 when the bottom cover member 46 sealingly engages the base member 56 of the enclosure portion 44, the seal 54 being effective for maintaining a carrier pressure $P_C$ that is at least a partial vacuum within the carrier 42. The stage member 26 carries a platform latch 59 for insuring that the bottom cover member 46 remains in place on the stage member 26 during movement thereof, the latch 59 being activated following placement of the carrier 42 onto the machine 10. The latch 59 is released in a conventional manner following completion of a processing cycle of the machine 10, wherein the stage member 26 is moved into the buffer chamber 14 as described below.

The top wall 20 of the machine has a downwardly facing elastomeric seal 60 that engages a seal land 62, the land 62 being formed on the underside of the base member 56. An outer perimeter extremity 64 of the base member 56 extends slightly below the land 62 and within a sloping guide flange 66 that extends upwardly from the top wall 20. An interface chamber 68 is formed between the bottom cover member 46 of the carrier 42 and the stage member 26 and within the main chamber opening 18 when the stage member 26 is fully raised, the chamber 68 having an interface pressure $P_T$.

An important feature of the present invention is that the interface chamber 68 is provided with an interface port 70.

The interface port 70 is in fluid communication with the interface chamber 68 and is fluid-connected an interface pump means 72 for evacuating the interface chamber 68 in preparation for lowering the stage member 26 by the elevator mechanism 22. Following evacuation of the interface chamber 68 by the pump means 72 to a desired pressure $P_S$ that is approximately equal to the carrier pressure $P_C$, and with the transfer chamber pressure $P_T$ being also maintained approximately equal to $P_C$, the cassette 48, together with the bottom cover member 46, is lowered into the buffer chamber 14 on the stage member 26 by the elevator mechanism 22.

Another important feature of the present invention is that the wafer carrier 42, which provides a microenvironment for the wafers, need not be placed in a separate housing to effect transfer. Thus, the carrier 42 is exposed to-ambient conditions during transfer, unlike the system of Davis et al., U.S. Pat. No. 5,044,871 which requires an upper load lock chamber into which the carrier is placed. This results in less complicated equipment, and quicker, more effective, and more efficient transfer, since it is not necessary to evacuate the upper chamber of a load lock. By "ambient conditions," there is meant the environment through which the wafer carrier is transported, which can be a clean room or other controlled or uncontrolled environment.

The interface chamber 68 has an interface volume $(V_I)$ that is very much smaller than the chamber volume $(V_T)$ of the buffer chamber 14 and the carrier volume $(V_C)$ of the carrier chamber 58, thereby facilitating rapid evacuation of the chamber 58 for enhancing the throughput of the machine 10. For example, the carrier volume $V_C$ can be on the order of 10 liters when the wafers 52 are 200 mm in diameter, and likewise the buffer chamber volume $V_T$ is on the order of 10 liters. Contrastingly, the interface volume generally is not more than about 100 cc. It can be only 40 cc based on an average depth of the interface chamber 68 being 0.4 mm under the bottom cover member 46 (within a diameter of 250 mm) and an average depth of 5 mm within a diameter of 260 mm of the main chamber opening 18. Thus the interface volume $V_I$ is preferably less than about 2% of the carrier volume $V_C$, less than about 2% of the buffer chamber volume $V_T$, and less than about 1% of the combined volume of the buffer chamber 14 and the carrier chamber 58. Grooves can be included in the interface to insure that the interface is evacuated.

The interface port 70 (also referred to as a passage) preferably is fluid-connected to a pressure sensor 79, the sensor 79 providing a sensor signal X to the controller 33 for preventing activation of the screw drive 32 for lowering the stage member 26 from its closed position until the interface pressure $P_I$ has been lowered to approximately match the carrier pressure $P_C$ within the carrier chamber 58. For this purpose, each of the wafer carriers 42 that is to be used with the machine 10 can be evacuated to a predetermined pressure such as $10^{-5}$ Torr, the desired pressure $P_S$ therefore also being approximately $10^{-5}$ Torr. In this version of the present invention, the pressure sensor 77 for the interface chamber 68 is operative for signalling the controller 33 when the sensed interface pressure $P_I$ drops to the predetermined desired pressure $P_S$. Correspondingly, the buffer chamber 14 is maintained at approximately the same predetermined pressure by the environmental control means 15. It will be understood that when other pressures are to be utilized within the buffer chamber 14, the controller 33 is operative for appropriately signalling the control means 15 for restoring the predetermined pressure within the chamber 14, prior to operation of the elevator mechanism 22. Further, the environmental control means 15 also provides a feedback signal, designated environment signal Z, to the controller 33 for verifying responses by the control means 15.

Preferably, and as further shown in FIG. 1, the carrier 42 is provided with a data block 76 for indicating the pressure within the carrier chamber 58 to data input means 78 on the machine 10, the data input means 78 providing a data signal Y to the controller 33. In its simplest form, the data block 76 is merely a label on which the pressure $P_C$ is written, perhaps together with wafer type identification and/or other desired process parameters for use in the processing by the machine 10. Other forms of the data block 10 that are within ordinary skill in the art of data communication include an electronic circuit having non-volatile memory, and movable mechanical indicia. Most preferably, and as indicated at 77 in FIG. 1, the data block 76 is responsive to the actual carrier pressure $P_C$, being fluid connected to the carrier chamber 58 through the enclosure portion 44. Correspondingly, the data input means 78 can comprise a conventional keypad, an electronic interface, or a position transducer, each being within the ordinary skill of those in data communication arts.

In preferred implementations of the present invention wherein the data block 76 is operative for signalling the actual carrier pressure $P_C$ to the controller 33 by way of the data input means 78 as described above, the environment signal Z also and correspondingly is indicative of the transfer chamber pressure $P_T$. Accordingly, the controller 33 is implemented in any conventional manner for preventing activation of the screw drive 32 until the sensor signal X approximately matches the interface signal Y while the environment signal Z is also being maintained in approximate correspondence with the interface signal Y.

As described above, the pressure, $P_T$, of the buffer chamber 14 can be controlled at suitable pressures that are compatible with the various wafer processes that are provided by the machine 10, the wafers always being subjected to the pressure $P_T$ when the stage member 26 is not sealingly closing the main chamber opening 18. Alternatively, and as further shown in FIG. 1, the buffer chamber 14 is also sealingly separated by a divider wall 80 from a transfer chamber 82, a slit valve (not shown) being provided in the divider wall 80 for permitting serial transport of the wafers 52 between the chambers 14 and 82 by conventional means (not shown), but pressure-isolating the transfer chamber 82 from the buffer chamber 14 at times when it is desired to evacuate the transfer chamber 82 to a hard vacuum such as $10^{-10}$ Torr. The chamber 82 can have a robot therein for transferring the wafers to processes such as deposition by chemical vapor deposition or plasma deposition; cleansing and etching; and the like. Alternatively, the chamber 82 itself can be used for such processing.

As further shown in FIG. 1, an exemplary configuration of the present invention has the carrier 42 loaded onto the machine 10 from above, the cassette 48 being lowered into the buffer chamber 14 by operation of the elevator mechanism 22. Alternatively, the base 12 can be inverted, the carrier 42 also being inverted and loaded from below the machine 10. In another alternative, the carrier 42 can be loaded at one side of the machine 10, the wafers 52 being oriented vertically rather than horizontally as shown in the drawings, the elevator mechanism 22 operating horizontally rather than vertically.

In use of a system according to the present invention, the wafer carrier 42 is placed on the top wall 20 of the buffer chamber 14 with the base member 56 inwardly of the guide 66. The interface chamber 68 is then evacuated with the pump 72 via the interface port 70. When the pressure $P_S$ in the interface chamber 68 is about equal to the pressure $P_C$ in the carrier, the stage member 26 of the buffer chamber 14 is lowered via the elevator mechanism 22, with the result that the bottom cover member 46 of the wafer carrier 42, as well as the wafer cassette 48, are lowered into the buffer chamber 14, as shown in phantom in FIG. 1. The semiconductor wafers 52 can then be accessed for processing.

The lowering and access to the semiconductor wafers 52 can be effected three ways. First, the stage member 26 can be lowered stepwise, i.e., by indexing, with the top wall lowered to provide access to one semiconductor wafer at a time. Secondly, the stage member 26 can be lowered all the way to the bottom of the buffer chamber 14, and left in that position so that all the semiconductor wafers are accessible. In a third version, after the stage member 26 is lowered to the lowest position as in option 2, the top wall is then raised stepwise, thereby providing access to the semiconductor wafers, one at a time.

If the carrier 42 is under vacuum, then atmospheric pressure on the carrier 42 exerts more force on the column member 24 than can be handled by a stepper motor. In each a situation, it is necessary to first disengage the stepper motor before loading the carrier 42 in place. After disengaging the stepper motor, the carrier 42 is positioned, latched carrier in place, and then the carrier 42 is lowered using a different motor. Next, the stepper motor is reengaged to stepwise raise and/or lower the cassette 48.

Although the present invention has been described in considerable detail with reference to certain preferred versions thereof, other versions are possible. For example, the environment maintained in the buffer chamber 14 and the carrier chamber 58 need not be subatmospheric, but can be any non-ambient environment, such as a low temperature environment; a high temperature environment; special gaseous environments such as nitrogen, argon, oxygen, or the like atmospheres; high pressure environments; and combinations thereof. All that is required under these conditions is to modify the environment in the interface chamber 68 through the port 70. Also, the object in the carrier chamber 55 need not be a cassette 58, but can be any object. Moreover, if the object is a cassette 58, it need not hold semiconductor wafers 52, but it can hold glass wafers or other products.

Therefore, the spirit and scope of the appended claims should not necessarily be limited to the description of the preferred versions contained herein.

What is claimed is:

1. A method of moving the contents of a second enclosure volume defined by a second enclosure into a first enclosure volume defined by a first enclosure while minimizing the contamination of either enclosure volume, comprising:

providing a wall portion of said first enclosure with a containment aperture therethrough;

providing a wall portion of the second enclosure with a service aperture therethrough;

selectively sealing the containment aperture with a first moveable wall;

selectively sealing the service aperture with a second moveable wall;

providing an extension portion about the periphery of said containment aperture; forming an interface volume by placing the second enclosure on said extension portion and aligning the service aperture within the extension portion wherein the interface volume is exposed to ambient conditions when the second enclosure is removed from the first enclosure;

conditioning the interface volume to approximately match the conditions existing in one of the first enclosure volume and the second enclosure volume while the interface volume is isolated from the first and second enclosure volumes; and then moving at least the first moveable wall into the first enclosure volume.

2. The method of claim 1, further including the steps of positioning an object on the second moveable wall.

3. The method of claim 1, further including the steps of extending a conditioning passage into communication with the interface volume.

4. The method of claim 3, further including the steps of:

maintaining a first pressure in the first enclosure volume;

maintaining a second pressure in the second enclosure volume; and changing the pressure in said interface volume to match at least one of the first pressure and the second pressure before moving the first moveable wall into the first enclosure volume.

5. The method of claim, 1, further including the steps of:

maintaining the second moveable wall in sealing engagement with the service aperture by maintaining a vacuum pressure in the second enclosure volume; and opening the service aperture by evacuating the interface volume to a pressure sufficient to overcome the vacuum holding the second moveable wall in sealing engagement with the service aperture.

6. The method of claim 1, further including the steps of:

providing a latch between the service aperture and the second moveable wall;

extending the latch to lock the second moveable wall in sealing engagement with the service aperture;

maintaining a vacuum in the first volume;

evacuating the interface volume to a pressure level sufficient, in the absence of the latch, to cause the second moveable wall to move from sealing engagement with the service aperture; and releasing the latch to allow the second moveable wall to move from sealing engagement with the service aperture.

7. The method of claim 6, further including the steps of:

first conditioning the interface volume to obtain conditions in the interface volume which are equivalent to the conditions in the second enclosure volume;

releasing the latch; then conditioning the interface volume to obtain conditions in the interface volume which are equivalent to the conditions in the first enclosure volume; and then moving the first moveable wall into the first enclosure volume.

8. The method of claim 7, wherein the step of releasing the latch positions the second moveable wall on the first moveable wall.

9. The method of claim 1, including the further steps of:

increasing the pressure in the interface volume and then decreasing the pressure in the interface volume before moving the first moveable wall into the first enclosure volume.

10. The method of claim 1, including the further steps of:

maintaining the second moveable wall on the first moveable wall as the first moveable wall is moved into the first enclosure volume.

* * * * *